United States Patent [19]
Saeki et al.

[11] Patent Number: 6,053,983
[45] Date of Patent: Apr. 25, 2000

[54] WAFER FOR CARRYING SEMICONDUCTOR WAFERS AND METHOD DETECTING WAFERS ON CARRIER

[75] Inventors: Hiroaki Saeki, Shirane-machi; Teruo Asakawa, Ryuo-cho, both of Japan

[73] Assignee: Tokyo Electron, Ltd., Tokyo-To, Japan

[21] Appl. No.: 09/071,833

[22] Filed: May 4, 1998

[30] Foreign Application Priority Data

| May 8, 1997 | [JP] | Japan | 9-134362 |
|---|---|---|---|
| May 8, 1997 | [JP] | Japan | 9-134363 |
| May 20, 1997 | [JP] | Japan | 9-145772 |

[51] Int. Cl.[7] .......................... C23C 16/00; B66C 23/00; B65G 23/00
[52] U.S. Cl. ...................... 118/728; 414/744.8; 414/751
[58] Field of Search .................. 118/728; 414/744.8, 414/751; 356/375

[56] References Cited

U.S. PATENT DOCUMENTS

| 4,875,824 | 10/1989 | Moe et al. | 414/751 |
| 4,971,512 | 11/1990 | Lee et al. | 414/744.8 |
| 5,133,635 | 7/1992 | Malin et al. | 414/744.8 |
| 5,792,304 | 8/1998 | Tamura et al. | 118/728 |
| 5,810,935 | 9/1998 | Lee et al. | 118/728 |

FOREIGN PATENT DOCUMENTS 7-231031  8/1995  Japan .

*Primary Examiner*—Frank G. Font
*Assistant Examiner*—Roy M. Punnoose
*Attorney, Agent, or Firm*—Smith, Gambrell & Russell, LLP; Beveridge, DeGrandi, Weilacher & Young Intellectual Property Group

[57] ABSTRACT

A plurality of projections 21 is disposed on a inner surface of a lid 20 which is detachably attached to a carrier body 10. Each projection 21 has a tapered end part 22 with inclined surfaces 23, 24. The surfaces 23, 24 are in the form of semitransparent mirror. A Light emitting device 47 projects light beam which travels horizontally to the projection 21 from outside of the lid 20. When a wafer is not present in slots 15 of the carrier body, the light beam travels to upper and lower adjacent photoelectric devices 48, 48 via the upper and lower adjacent projections 21. The semitransparent mirror 23, 24 changes the light beam traveling direction. When the wafer is present in the slots 15, the light beam is intercepted by the wafer, and the photoelectric devices 48 does not receive the light beam. In aforementioned manner, whether a wafer is present or not in the slots 15 can be detected.

15 Claims, 10 Drawing Sheets

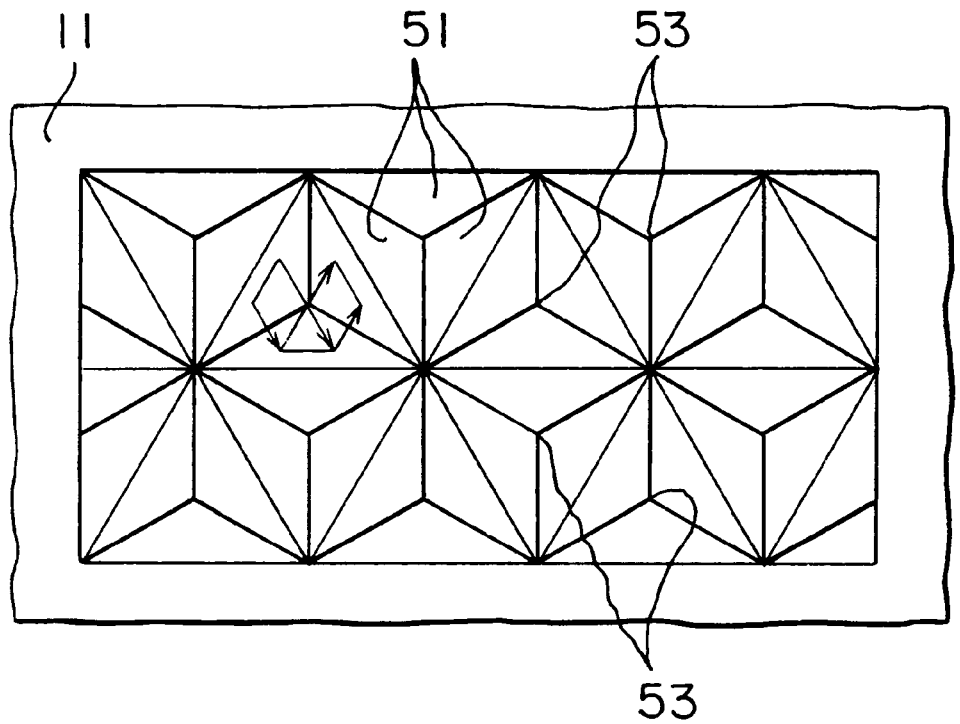
F I G. 7
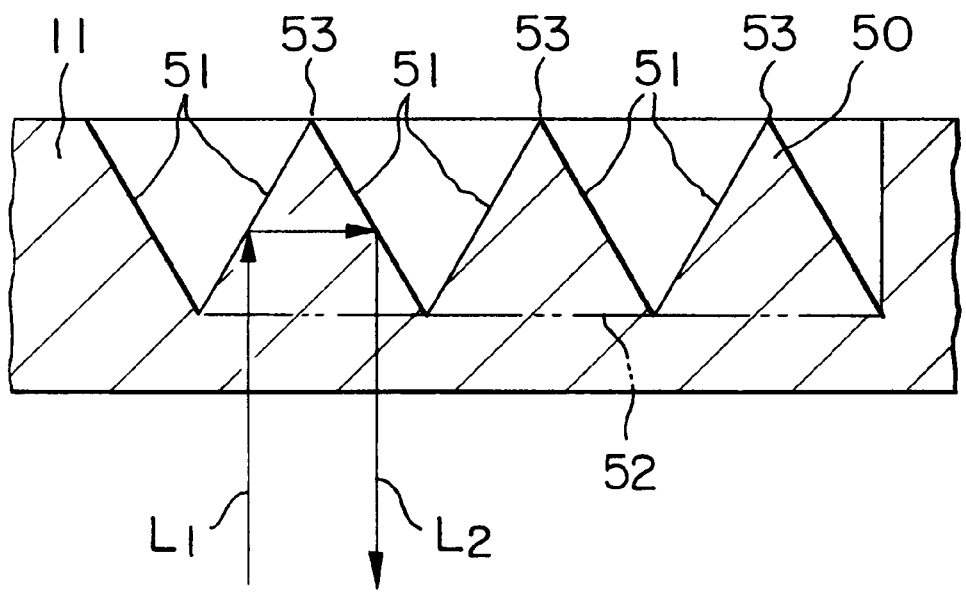
F I G. 8

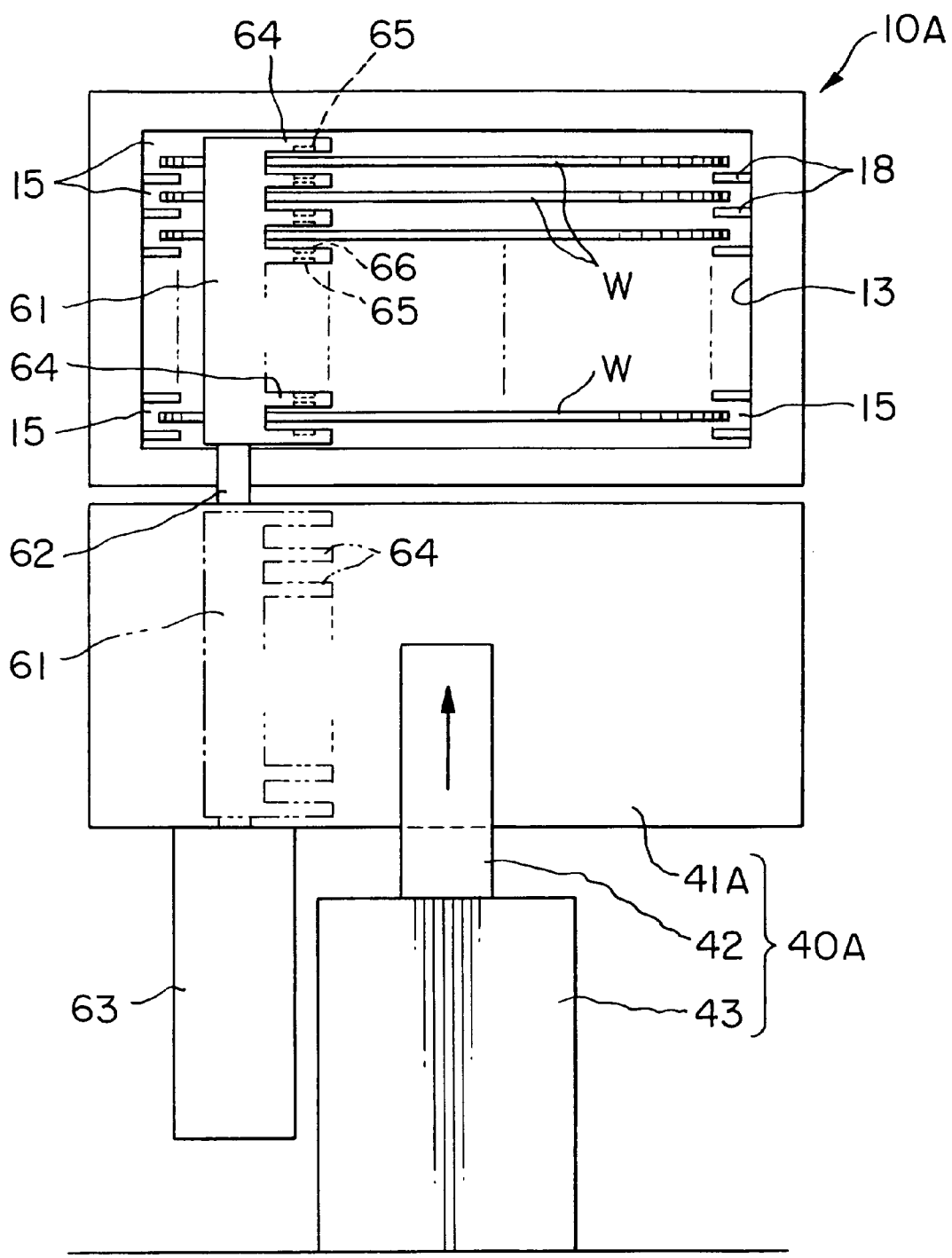
F I G. 9

WAFER FOR CARRYING SEMICONDUCTOR WAFERS AND METHOD DETECTING WAFERS ON CARRIER

BACKGROUND OF THE INVENTION

1. Field of the Invention

The present invention relates to a carrier for carrying semiconductor wafers in a semiconductor device fabricating system, and a method of detecting wafers carried on a carrier.

2. Description of the Related Art

A carrier is used for carrying semiconductor wafers between semiconductor device fabricating equipment and inspection equipment. The carrier contains a predetermined number of wafers, such as thirteen or twenty-five wafers. Wafers are contained in carriers in lots, and are carried between the equipment in lots.

Wafer map of the wafers contained in the carrier are produced when subjecting the wafers to various processes. A semiconductor device fabricating system makes reference to the wafer map when subjecting the wafers to various processes, and records data about the results of the processes on the basis of the wafer map. When executing wafer mapping, it is necessary to detect the wafers stored in the slots of the carrier. It is also necessary to know, prior to subjecting the wafers to a process, if all the wafers have been taken out of the carrier.

In recent years, there is a trend toward the prevalent use of 12 in. (300 mm) diameter wafers instead of 6 in. and 8 in. diameter wafers, and semiconductor device fabricating systems and carriers for use in processing 12 in. diameter wafers have been developed. Carriers for carrying 12 in. diameter wafers are classified roughly into open carriers, and carriers enclosed in a pod, such as a unified pod, and it is expected that the latter will be used prevalently in the future.

In addition to progressive increase in the diameter of wafers, the continued reduction of the minimum device dimension has realized hyperfine configurations of the minimum feature length of sub-quarter $\mu$m. Accordingly, the importance of techniques for the preparation of ultraclean rooms, the automatic transportation of wafers and the reduction of spaces for the installation of semiconductor device fabricating equipment and inspection equipment for semiconductor device manufacturing plants has progressively increased. The wafer detector becomes more important if the automation of semiconductor device fabricating equipment is promoted to reduce semiconductor device fabricating processes requiring operators work. Increase in the diameter of wafers entails sharp increase in the price of wafers. Therefore, it become more important to process large wafers correctly without failure. Consequently, the necessity of correct wafer mapping for the recognition of wafers contained in a carrier and reliable detection of wafers remaining in the carrier is augmented.

Semiconductor device fabricating systems are provided with water detectors employing a light emitting device and a photoelectric device to detect wafers optically. Some wafer detector of a direct reception type is provided with a light emitting device and a photoelectric device disposed opposite to each other, for example, above and below, or on the right and the left side, respectively, of a carrier to detect wafers contained in the carrier when the carrier is disposed between the light emitting device and the light receiving device. The wafer detector of this type projects a light beam by the light emitting device toward the photoelectric device, and decide that any wafer does not exist in slots in the carrier if the light beam is received by the photoelectric device and that a wafer is left in a slot if the light beam projected by the light emitting device is unable to fall on the photoelectric device.

Some wafer detector of a reflection type is provided with a light emitting device and a photoelectric device disposed side by side on one side of a carrier, and a reflecting mirror disposed on the opposite side of the carrier to detect wafers contained in the carrier when the carrier is disposed between the light emitting device and the light receiving device, and the reflecting mirror. The wafer detector of this type projects a light beam by the light emitting device toward the reflecting mirror, and decide that any wafer does not exist in slots in the carrier if the light beam reflected by the reflecting mirror is received by the photoelectric device and that a wafer is left in a slot if the light beam reflected by the reflecting mirror is not unable to fall on the photoelectric device.

The light emitting device and the photoelectric device are disposed above and below, or on the right and the left side, respectively, of a carrier transportation path or a carrier holding place in the former wafer detector, and the light emitting device and the photoelectric device, and the reflecting mirror are disposed above and below, or on the right and the left side, respectively, of a carrier transportation path or a carrier holding place in the latter wafer detector. Therefore, the water detector obstructs the transportation of the carrier. Such a wafer detector is disadvantageous in view of saving space because special spaces must be spared for the light emitting device, the photoelectric device and the reflecting mirror. The wafer detector of a reflection type is unable to discriminate between a light beam reflected from the reflecting mirror and a light beam reflected from a wafer and may possibly make faulty detection.

SUMMARY OF THE INVENTION

Accordingly, it is an object of the present invention to provide a novel carrier capable of solving the foregoing problems and to provide a method of detecting wafers contained in a carrier. The present invention (1) increases the degree of freedom of selection of a place for a wafer detector, (2) reduces a space necessary for installing a wafer detector, and (3) enables the highly accurate, reliable detection of wafers in a carrier.

According to a first aspect of the present invention, a carrier for containing and carrying semiconductor wafers is provided which comprises a carrier body for containing a plurality of wafers at fixed intervals, a lid detachably attached to the carrier body, a plurality of projections formed on an inner surface of the lid so that the adjacent projections lie at the opposite sides of a wafer, respectively, when wafers are put in the carrier body and the lid is attached to the carrier body, and optical elements provided respectively at the projections to reflect a light beam traveling through each projection substantially in parallel to a surface of the wafer in a direction substantially perpendicular to the surface of the wafer, and to reflect the light beam traveling in the direction substantially perpendicular to the surface of the wafer in a direction substantially parallel to the surface of the wafer.

According to a second aspect of the present invention, a carrier for containing and carrying semiconductor wafers is provided which comprises a carrier body for containing a plurality of wafers at fixed intervals, a plurality of projections formed on an inner surface of the carrier body so that adjacent projections lie at the opposite sides of a wafer, respectively, when wafers are put in the carrier body, and optical elements provided at the projections to reflect a light beam traveling through each projection substantially in parallel to a surface of the wafer in a direction substantially perpendicular to the surface of the wafer and to reflect the light beam traveling in a direction substantially perpendicular to the surface of the wafer in a direction substantially parallel to the surface of the wafer.

The optical elements may be semitransparent mirrors.

According to a third aspect of the present invention, a method of detecting wafers contained in a carrier is provided which comprises the steps of: projecting a light beam in a direction substantially in parallel to the surface of the wafer on an optical element disposed above or below the surface of the wafer, changing said direction of the light beam in another direction substantially perpendicular to the surface of the wafer by the optical element, and detecting the light beam after changing the direction thereof, in which a decision is made on whether or not any wafers exist in the carrier on the basis of a result of detection of the light beam.

According to a fourth aspect of the present invention, a carrier for containing and carrying semiconductor wafers is provided which comprises a carrier body for containing a plurality of wafers at fixed intervals and having optically transparent walls, and a corner cube disposed within the carrier body.

According to a fifth aspect of the present invention, a carrier for containing and carrying semiconductor wafers is provided which comprises a carrier body for containing a plurality of wafers at fixed intervals and having optically transparent walls, a lid detachably attached to the carrier body, and a corner cube disposed on the lid and having reflecting surfaces facing an interior of the carrier body.

According to a sixth aspect of the present invention, a method of detecting wafers contained in a carrier is provided which comprises the steps of: projecting a light beam from outside a carrier body having optically transparent walls through the optically transparent wall on a corner cube disposed within the carrier body, and detecting a reflected light beam reflected from the corner cube at a position outside the carrier body, in which a decision is made on whether or not the wafers exist in the carrier on the basis of a result of detection of the reflected light beam.

BRIEF DESCRIPTION OF THE DRAWINGS

FIG. 7 is an enlarged plan view of corner cubes;

FIG. 8 is an enlarged sectional view of the corner cubes;

FIG. 9 is a front view of assistance in explaining the operation of a wafer detector, as viewed from the side of a transfer chamber;

DESCRIPTION OF THE PREFERRED EMBODIMENTS

First Preferred Embodiment

Figure 1:
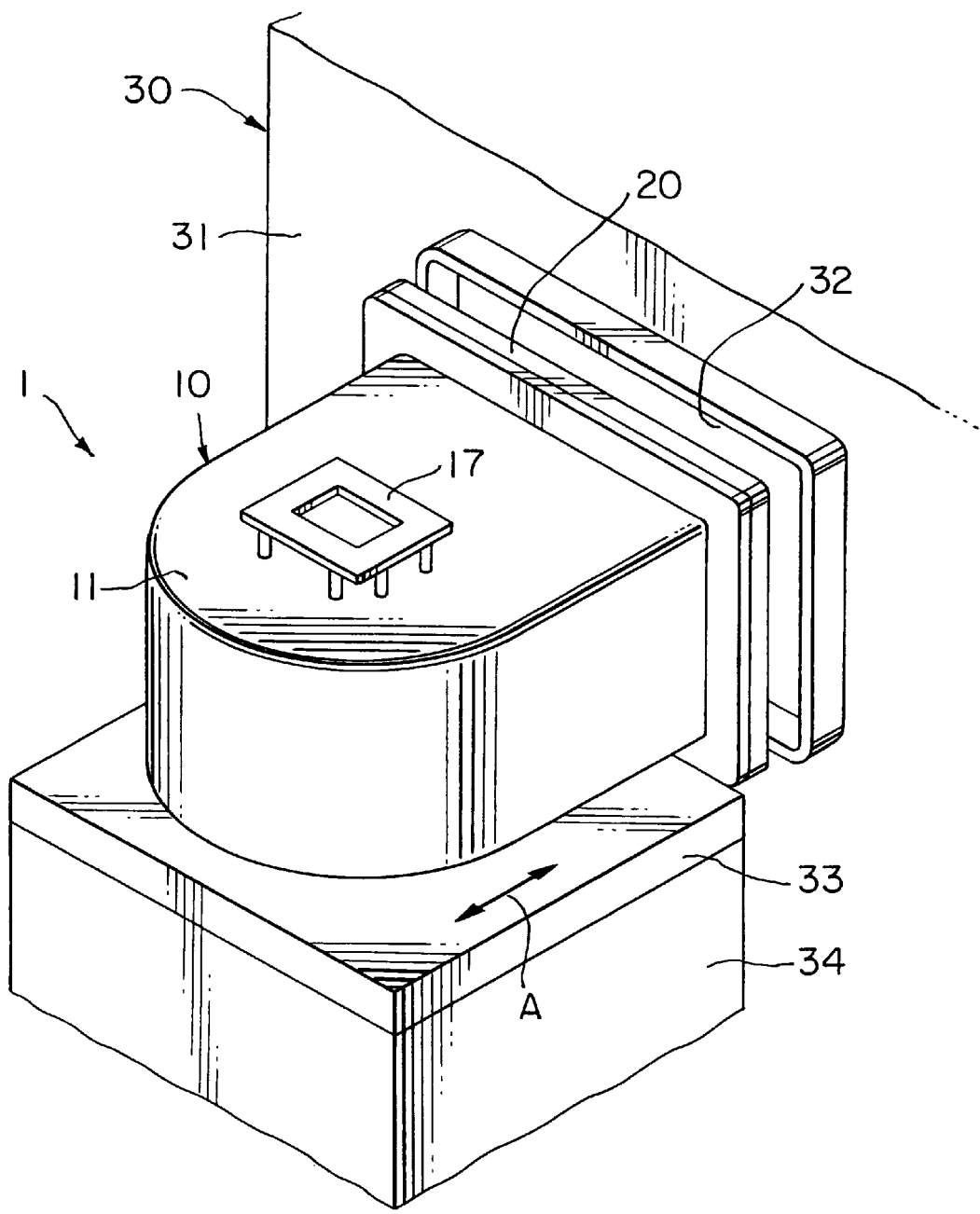
FIG. 1 is a perspective view of a carrier in a first embodiment according to the present invention mounted on a carrier table included in a semiconductor device fabricating system.
Figure 2:
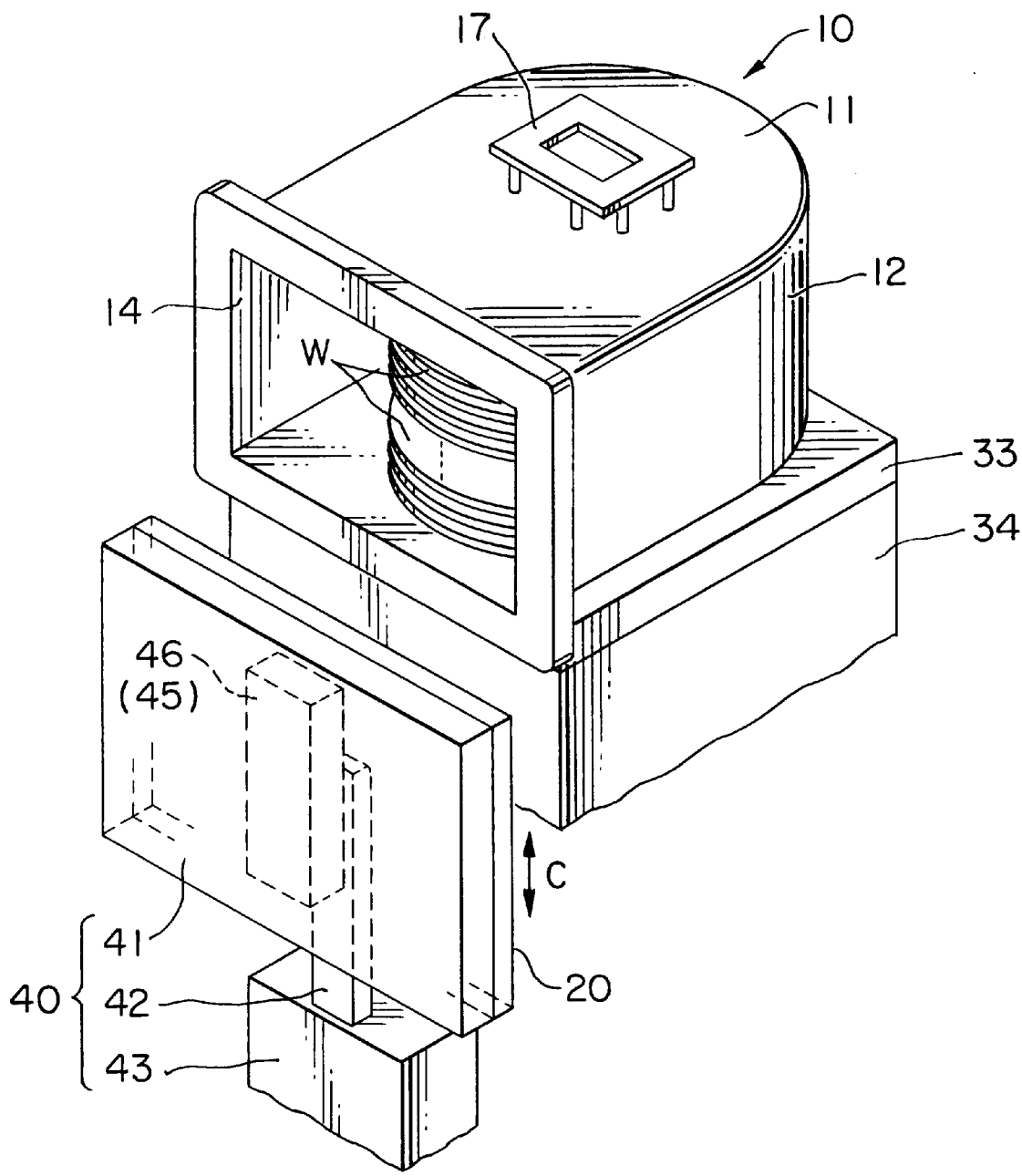
FIG. 2 is a perspective view of the carrier of FIG. 1 mounted on the carrier table, in which a front panel of the semiconductor device fabricating system is omitted.

A carrier 1 in a first embodiment according to the present invention will be described with reference to FIGS. 1 to 4. The carrier 1 is a closed pod made of a synthetic resin, such as a polycarbonate resin or a PEEK (poly(ether ether ketone)) resin. The carrier 1 has a capacity to contain, for example, thirteen or twenty-five 12 in. (300 mm) diameter wafers.

The carrier 1 comprises a carrier body 10 and a lid 20. The carrier body 10 can contain a plurality of wafers W in a parallel arrangement at fixed intervals. The carrier body 10 has an opening 14 which allows insert wafers W into and to take out the wafers W the carrier body 10 therethrough. The lid 20 is detachably attached to the carrier body 10 to close an opening 14. The carrier body 10 and the lid 20 are optically transparent. A plurality of horizontal projections 18 are formed on an inner surface of a side wall 12 of the carrier body 10 at fixed vertical intervals so as to define slots 15 for receiving the wafers W therein in a horizontal position between the adjacent projections 18.

A carrying handle 17 is attached to a top wall 11 of the carrier body 10. An overhead carrier transporting device, not shown, installed in the semiconductor device fabricating plant grips the carrying handle 17 when transporting the carrier 1 automatically between pieces of semiconductor device fabricating apparatus.

When using the carrier 1, an inert gas, such as nitrogen gas, is sealed in the carrier 1 to prevent the natural oxidation of the wafers W and to create a clean environment in the carrier 1.

Figure 4:
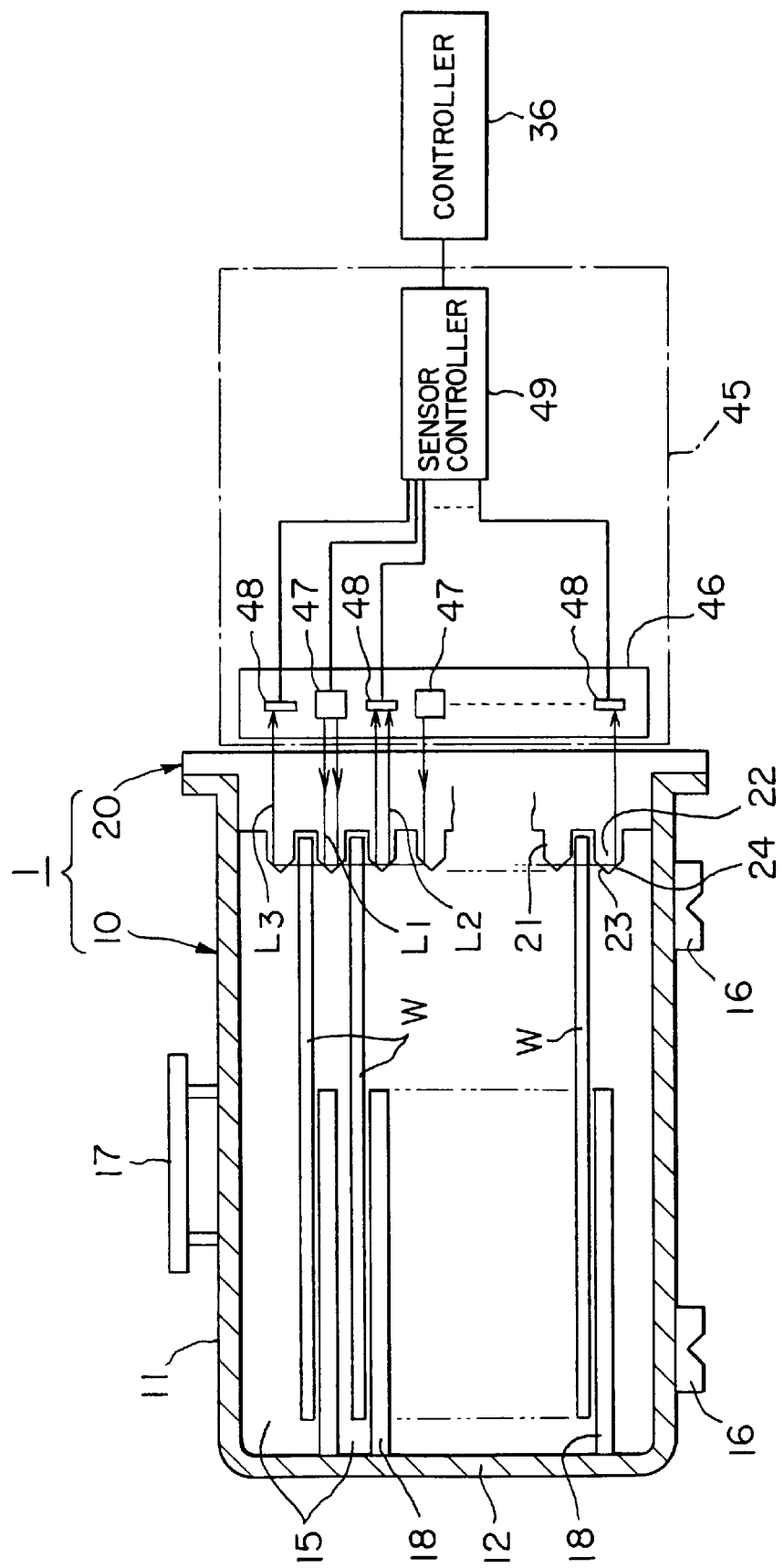
FIG. 4 is a sectional side view showing the relation between the carrier of FIG. 1 and a carrier detector.

As best shown in FIG. 4, a plurality of horizontal projections 21 similar to teeth of a comb are formed on an inner surface of the lid 20. When the wafers W are put in the carrier body 10 and the lid 20 is fitted on the carrier body 10, the wafers W are located between vertically adjacent projections 21.

Each projection 21 has a tapered end part 22 having an upper inclined surface 23 and a lower inclined surface 24. The upper and lower inclined surfaces 23 and 24 are inclined at an angle of 45° to a horizontal plane including the surface of the wafer W, and intersect each other at an angle of 90°. The upper and lower inclined surfaces 23, 24 are formed so as to serve as semitransparent mirrors.

Figure 3:
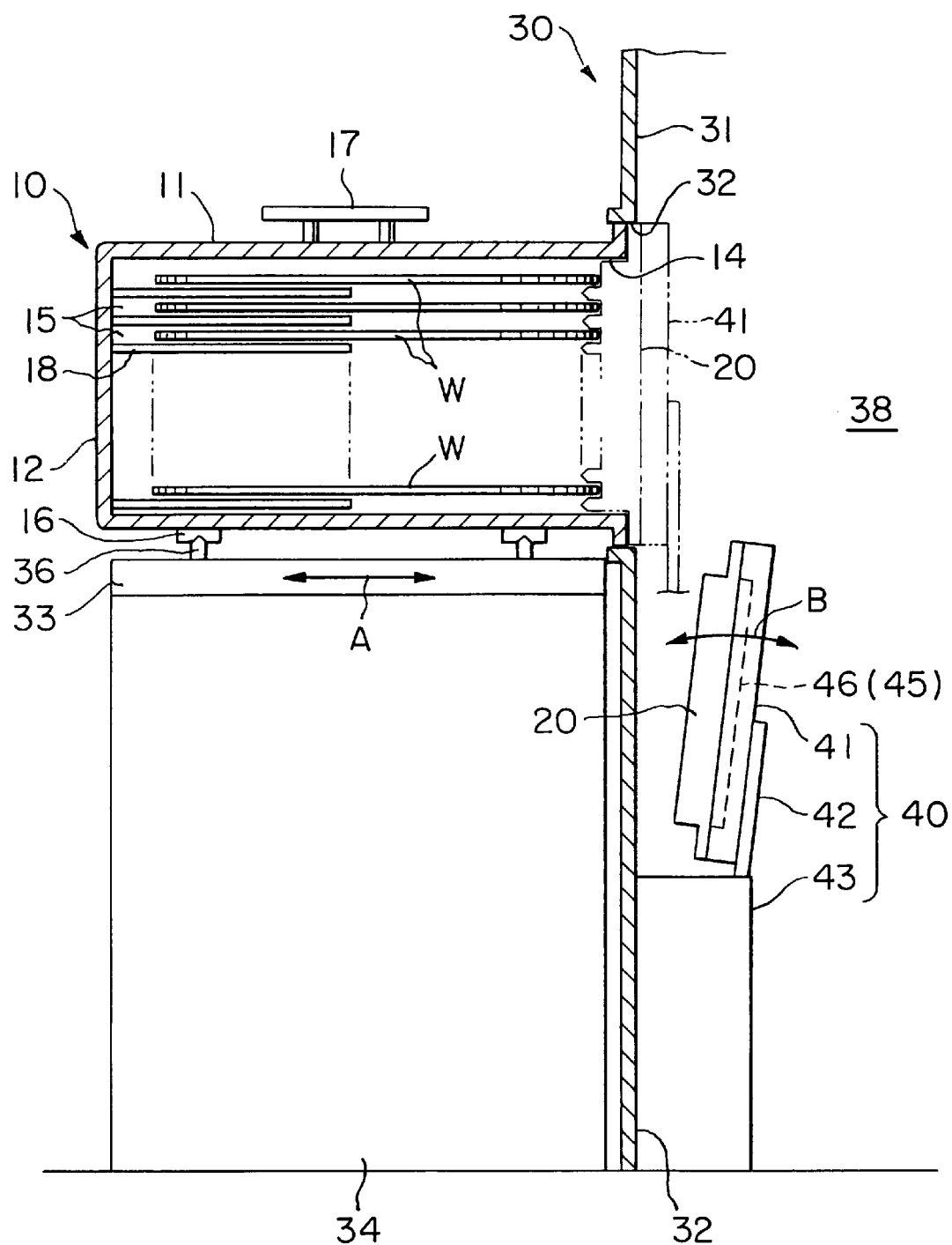
FIG. 3 is a sectional side view showing the relation between the carrier of FIG. 1 and the semiconductor device fabricating system.

As shown in FIGS. 1 and 3, a front panel 31 included in a semiconductor device fabricating system 30 is provided with an opening 32 in which the lid 20 of the carrier 1 and the open end of the carrier body 10 are fitted.

A wafer transfer chamber 38 is defined behind (on the right side as viewed in FIG. 3) of the front panel 31. A wafer transporting mechanism, not shown, is installed in the wafer transfer chamber 38. When the lid 20 of the carrier 1 is removed, the wafer transporting mechanism transfers all the wafers W simultaneously from the carrier body 10 to the transfer chamber 38. Then, the wafers W are transported sequentially to a plurality of processing chambers, not shown, of the semiconductor device fabricating system 30 to subject the wafers W to predetermined processes.

A carrier table 33 for supporting the carrier 1 thereon is disposed in front of the front panel 31. The carrier table 33 is supported on a base 34 so as to be able to move toward and away from the opening 32 of the front panel 31 as indicated by the arrows A in FIG. 1.

The carrier table 33 is provided on its upper surface with, for example, four positioning projections 36 (only two of those projections are shown). The carrier 1 is provided in the lower surface of its bottom wall with positioning recesses 16 respectively corresponding to the positioning projections 36. The carrier 1 is positioned on the carrier table 33 by fitting the positioning projections 36 in the corresponding positioning recesses 16, respectively.

A lid opening mechanism 40 is disposed behind the front panel 31. The lid opening mechanism 40 comprises a lid holding member 41 which holds the lid 20 of the carrier 1 by suction, a support member 42 for supporting the lid holding member 41, and a pneumatic cylinder actuator 43 for vertically moving the support member 42. The support member 42 is capable of turning in the directions of the arrows C indicated in FIG. 2. The lid holding member 41 is provided with a built-in lock operating mechanism, not shown, for operating a locking mechanism, not shown, for locking the lid 20 of the carrier 1.

The lid holding member 41 is provided with a wafer detector 45 for detecting the wafers W remaining in the carrier body 10. The wafer detector 45 has a sensor array 46 including a plurality of light emitting devices 47 and a plurality of photoelectric devices 48 arranged in a unit, and a sensor controller 49 for the sequential control of the light emitting devices 47 and the photoelectric devices 48 of the sensor array 46. The sensor controller 49 is controlled for operation by a controller 36 which controls the general operations of the semiconductor device fabricating system 30.

FIG. 4 shows the positional relationship between the sensor array 46 and the lid 20 when the lid holding member 41 is at a position indicated by alternate long and two short dashes lines in FIG. 3. In FIG. 4, the lid holding member 41 is omitted for simplicity. The light emitting devices 47 and the photoelectric devices 48 are arranged alternately in a vertical row so as to correspond to the projections 21 of the lid 20, respectively.

The operation of the first embodiment will be described hereinafter. Referring to FIG. 3, the carrier transporting device, not shown, grips the carrying handle 17, transports the carrier 1 and places the carrier 1 on the carrier table 33 of the semiconductor device fabricating system 30. The carrier table 33 is advanced toward the front panel 31, and the lid 20 of the carrier 1 is fitted in the opening 32 of the front panel 31. Subsequently, the lid holding member 41 of the lid opening mechanism 40 is raised to the position indicated by alternate long and two short dashes lines in FIG. 3. The lid holding member 41 holds the lid 20 by suction and is moved together with the lid 20 to a position indicated by continuous lines in FIG. 3 to open the opening 14 of the carrier body 10.

Subsequently, the wafer transporting mechanism, not shown, transfers all the wafers W simultaneously from the carrier body 10 to the transfer chamber 38. Then, the lid opening mechanism 40 is moved to the position indicated by alternate long and two short dashes lines in FIG. 3, and puts the lid 20 on the carrier body 10 to close the opening Then the wafer detector 45 operates to see whether or not any wafers W are left in the carrier body 10. The sensor controller 49 of the wafer detector 45 makes the uppermost light emitting device 47 project light beams L1 traveling horizontally and perpendicularly to the lid 20 of the carrier 1 on the outer surface of the lid 20. The light beams L1 travel through the transparent lid 20 and fall on the upper inclined surface 23 and the lower inclined surface 24 of the illuminated projection 21.

As mentioned above, the inclined surfaces 23, 24 of each projections 21 are in the form of semitransparent mirror. Accordingly, the light beam L1 is reflected downward by the surface 23 in a direction at an angle of 90° to a direction in which the light beam L1 falls on the inclined surface 23. Also, the light beam L1 is reflected upward by the lower inclined surface 24 in a direction at an angle of 90° to a direction in which the light beam L1 falls on the lower inclined surface 24. That is, the light beams L1 are reflected in directions perpendicular to the surfaces of the wafers W. Part of a reflected light beam L2 reflected from the upper inclined surface 23 of the illuminated projection 21 travels through the lower inclined surface 24 of the illuminated projection 21 and the upper inclined surface 23 of the lower adjacent projection 21. Then, the light beam L2 falls on the lower inclined surface 24 of the lower adjacent projection 21. The lower surface 24 reflects light beam L2, so as to change the light beam traveling direction at an angle of 90°. Then, the light beam L2 travels through the lower adjacent projection 21, and falls on the photoelectric device 48 lying below and adjacent to the actuated light emitting device 47.

In the same manner, a reflected light beam L3, which is reflected from the lower inclined surface 24 of the illuminated projection 21, travels through the upper inclined surface 23 of the illuminated projection 21 and the lower inclined surface 23 of the upper adjacent projection 21. Then, the light beam L3 is reflected by the upper inclined surface 23 of the upper adjacent projection 21, and falls on the photoelectric device 48 lying above and adjacent to the actuated light emitting device 47.

If the wafer W remains in either the top slot 15 or the second top slot 15, either the reflected light beam L2 or L3 is intercepted and the corresponding photoelectric device 48 does not receive the reflected light beam L2 or L3. If the wafers W remain in both the top slot 15 and the second top slot 15, both the reflected light beams L2 and L3 are intercepted, and both the corresponding photoelectric devices 48 do not receive the reflected light beams L2 and L3. Thus, the wafer or wafers W remaining in the carrier body 10, if any, can be detected.

The rest of the light emitting devices 47 are actuated sequentially to project light beams L1, and the upper and lower adjacent photoelectric devices 48, 48 detects reflecting beam L2 and L3. Thereby, wafers W remaining in the slots 15 of the carrier body 10, if any, can be detected from the condition of photoelectric devices 48.

The aforementioned operation of the wafer detector 45 as used for detecting the wafers W left in the carrier body 10, to confirm the fully vacant state of the carrier body 10. However, the wafer detector 45 may be used also to detect the wafers W stored in the slots 15 of the carrier body 10 for wafer mapping to confirm the contents of the carrier body 10 before transferring the wafers W from the carrier body 10 to the transfer chamber 38.

As is apparent from the foregoing description, the carrier 1 in the first embodiment enables the reliable detection of the wafers W existing in the wafer body 10.

Any special space need not be spared for the wafer detector 40 and the wafer detector 45 does not obstruct the transportation of the wafers W because the sensor array 46 is incorporated into the lid opening mechanism 40.

The wafers W remaining in the carrier body 10, if any, can be surely detected even if the lid 20 is not optically very accurate because the optical paths between the light emitting device 47 and the associated photoelectric devices 48 are short.

Although the first embodiment uses the inclined surfaces 23 and 24 of each projection 21 as optical elements for reflecting the light beams, i.e., optical reflecting means, the tapered end part 22 of each projection 21 may be replaced with a prism for the same effect.

Although the sensor array 46 is incorporated into the lid opening mechanism 40 in the first embodiment, the sensor array 46 may be incorporated into carrier body 10 or the lid 20. If the sensor array 46 is incorporated into the lid 20, the projections 21 can be used for the foregoing functions.

If projections are formed on the carrier body 10, the positions of the projections must correspond to the position of the sensor array 46. For example, the projections 18, which are formed on the inner surface of the side wall 12 of the carrier body 10 and defining the slots 15, may be provided with end parts capable of serving as semitransparent mirrors if the sensor array 46 is attached to the side wall of the carrier body 10.

The sensor controller 49 is mounted on the carrier 1, and a circuit for recognizing the identification numbers of the photoelectric devices 48 is incorporated into the carrier 1 if the sensor array 46 is incorporated into the carrier body 10. This arrangement enables the detection of the wafers W remaining in the carrier 1, if any, without using the semiconductor device fabricating system or the inspection apparatus. If this arrangement is employed, results of wafer mapping carried out to examine the condition of the carrier body 10 or to find the wafers W remaining in the carrier body 10 can be communicated to the semiconductor device fabricating system or the inspection apparatus.

Although the light emitting devices 47 and the photoelectric devices are disposed so as to correspond to the projections of the lid 20, respectively, in the first embodiment, a detector constructed by supporting one light emitting device and one photoelectric device on a movable member may be moved vertically relative to the carrier 1 to inspect the slots 15 one by one to detect the wafer W remaining in each slot 15, if any.

As is apparent from the foregoing description, the carrier in the first embodiment enables the use of a wafer detector requiring a reduced space for installation, not obstructing the movement of the carrier and capable of surely detecting the wafers remaining in the carrier body, if any.

Second Preferred Embodiment

A carrier 1 in a second embodiment according to the present invention will be described with reference to FIGS. 5 to 13, in which parts like or corresponding to those of the carrier 1 in the first embodiment are designated by the same reference characters and the description thereof will be omitted to avoid duplication.

Figure 5:
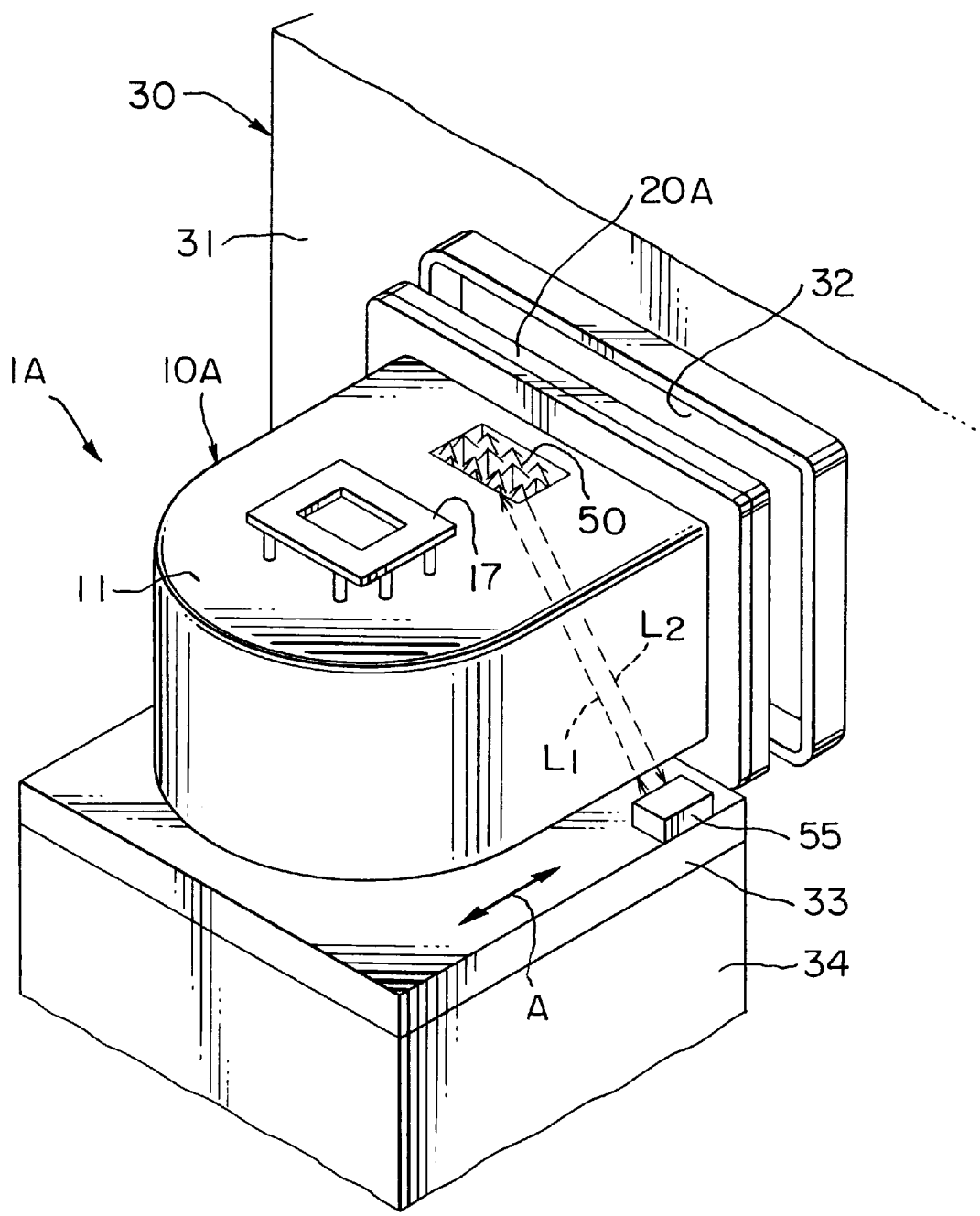
FIG. 5 is a perspective view of a carrier in a second embodiment according to the present invention mounted on a carrier table included in a semiconductor device fabricating system.
Figure 6:
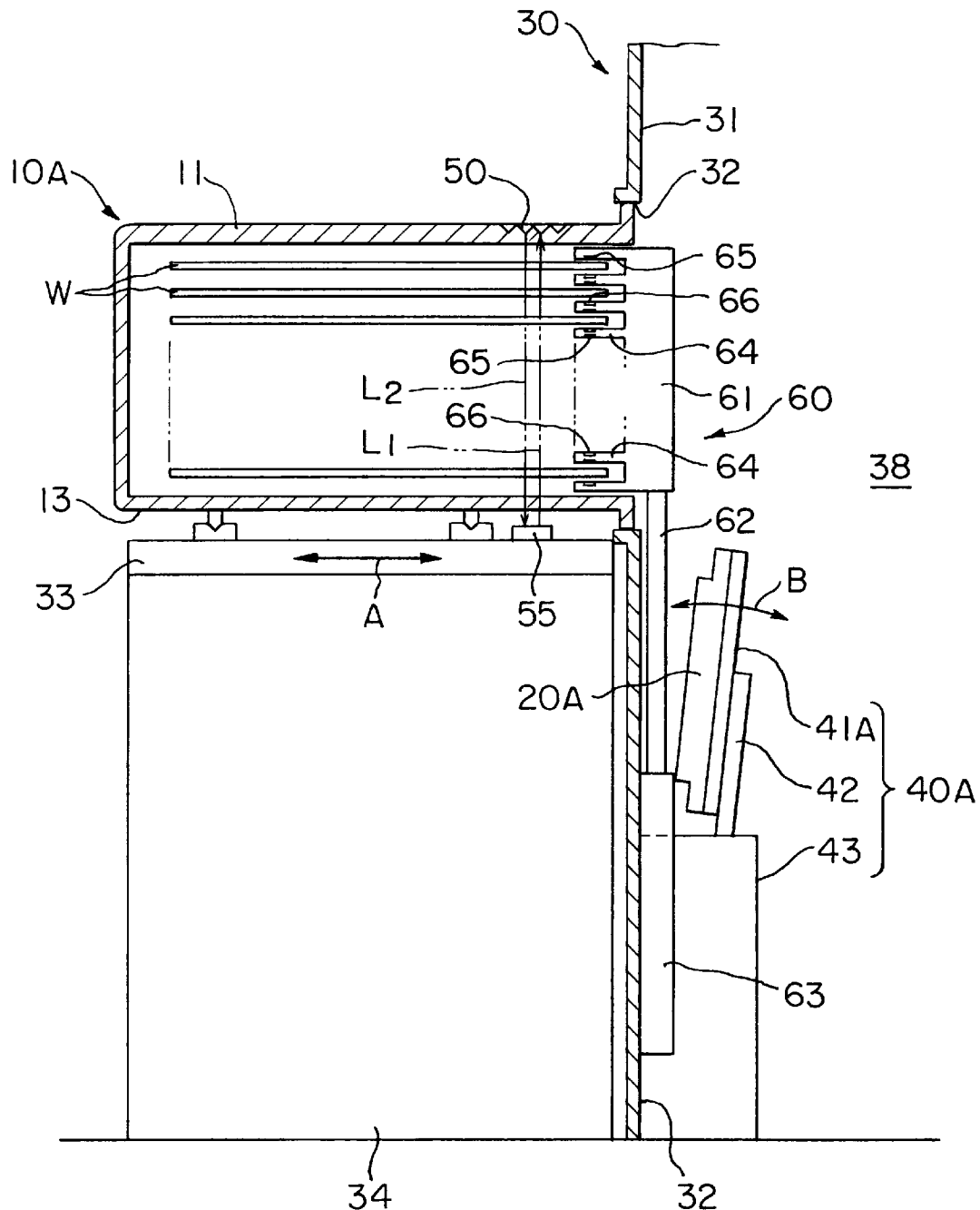
FIG. 6 is a sectional side view showing the relation between the carrier of FIG. 5 and the semiconductor device fabricating system.

Referring to FIGS. 5 and 6, a carrier 1A has a carrier body 10A having a top wall 11 provided with a plurality of corner cubes 50 formed in lines and columns in part thereof. The carrier body 10A in the second embodiment differs from the carrier body 10 in the first embodiment only in that the carrier body 10A is provided with the corner cubes 50. A lid 20A included in the carrier 1A in the second embodiment differs from the lid 20 in the first embodiment only in that the lid 20A is not provided with any projection corresponding to the projection 21 formed on the lid 20.

As shown in FIGS. 7 and 8, each of the corner cubes 50 is a reflecting mirror having three perpendicularly intersecting reflecting surfaces 51 and having the shape of a triangular pyramid. The corner cubes 50 is formed integrally with the carrier body 10A and is formed of the same transparent material as the carrier body 10A. Preferably, the outer surface of the carrier body 10A forming the back surfaces of the reflecting surfaces 51 is coated with a film to prevent the transmission of light beams through the reflecting surfaces 51 and to enhance the light reflectivity of the reflecting surfaces 51.

Imaginary bottom surfaces 52 of the corner cubes 50 having the shape of a triangular pyramid extend within the top wall 11. The imaginary bottom surfaces 52 are included in a plane parallel to the inner surface of the top wall 11. The vertices of the corner cubes 50 are included in a plane parallel to the imaginary bottom surfaces 52.

A light beam L1 incident on the imaginary bottom surface 52 of the corner cube 50 is reflected three times by the three reflecting surfaces 51, i.e., once by each of the three reflecting surfaces 51, and a reflected light beam L2 travels through the imaginary bottom surface 52 out of the corner cube 50. The incident light beam L1 and the reflected light beam L2 are parallel regardless of the angle of incidence of the incident light beam L1 on the imaginary bottom surface 52.

As shown in FIGS. 5 and 6, a wafer detector 55 is disposed on the upper surface of a carrier table 33 at a position near one side edge of the carrier table 33 and near a front panel 31 included in a semiconductor device fabricating system 30. The wafer detector 55 comprises a light emitting device, not shown, and a photoelectric device, not shown. An optical element, such as a polarization filter or a wave plate, not shown, is combined with the light emitting device to polarize a light beam emitted by the light emitting device. A polarization filter, not shown, is disposed in front of the photoelectric device.

As shown in FIGS. 6 and 9, a wafer detecting unit 60 is disposed on the back side of the front panel 31 of the semiconductor device fabricating system 30 and on one side of a support member 42 included in a lid opening mechanism 40A. Thus, the wafer detecting unit 60 is disposed so as to use a dead space in the lid opener 40A effectively. The lid opening mechanism 40A in the second embodiment differs from the lid opening mechanism 40 in the first embodiment only in that the lid opening mechanism 40A includes a lid holding member 41A not provided with any device corresponding to the wafer detector 45.

Figure 10:
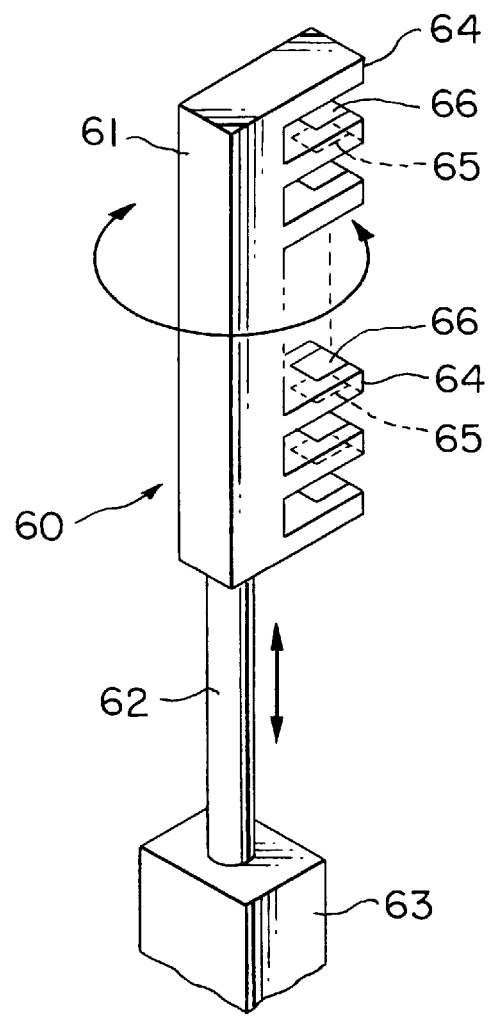
FIG. 10 is an enlarged perspective view of the wafer detector.
Figure 11:
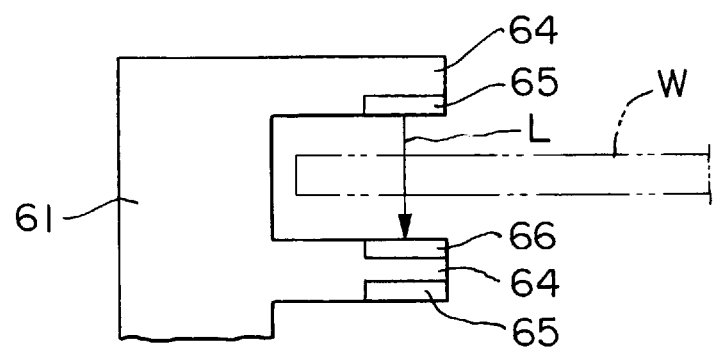
FIG. 11 is an enlarged perspective view of a holding member included in the wafer detector.

As best shown in FIGS. 10 and 11, the wafer detecting unit 60 has a holding member 61 provided with a plurality of projections 64 formed in an arrangement like the teeth of a comb. The pitch of the projections 64 is equal to that of slots 15 defined on the side wall of the carrier body 10A. A light emitting device 65 and a photoelectric device 66 are attached to the lower and the upper surface, respectively, of each projection 64. The top projection 64 is provided only the light emitting device 65 on its lower surface, and the bottom projection 64 is provided with only the photoelectric device 66 on its upper surface.

The holding member 61 is connected to an operating rod 62 included in a pneumatic cylinder actuator 63. A motor, not shown, is held on the operating rod 62 and interlocked with the holding member 61 to turn the holding member 61 through an angle of 90° in opposite directions. The holding member 61 may be moved by any suitable driving mechanism other than the pneumatic cylinder actuator 63.

The operation of the second embodiment will be described hereinafter. The carrier 1A is placed at a predetermined position on the carrier table 33. The carrier table 33 is advanced toward the front panel 31 of the semiconductor device fabricating system 30, and the lid 20A of the carrier 1A is fitted in an opening 32 formed in the front panel 31.

Then the lid holding member 41A of the lid opening mechanism 40A is raised to its working position, and the lid holding member 41A holds the lid 20 by suction and is moved together with the lid 20. The lid 20 is held at a position shown in FIG. 6 until a detecting operation for detecting wafers W and a wafer transfer operation are completed.

Then the holding member 61 of the wafer detecting unit 60 is raised from its standby position indicated by alternate long and short dash lines in FIG. 9, and is held in place at a working position indicated by continuous lines.

Subsequently, the motor for turning the holding member 61 is actuated to turn the holding member 61 through an angle of 90° from a position shown in FIG. 9 to a position shown in FIG. 6. According to the above movement of the holding member 61, the projections 64 of the holding member 61 are inserted in spaces between the wafers W stored in the carrier body 10A. In this state, each wafer W is interposed between the light emitting device 65 attached to the upper adjacent projection 64 and the photoelectric device 66 attached to the lower adjacent projection 64. In the state where the projections 64 are inserted in the spaces between the wafers W, small spaces are formed between the light emitting device 65 and the wafer W and between the photoelectric device 66 and the wafer W, respectively.

A sensor controller, not shown, makes the light emitting devices 65 emit a light beam L as shown in FIG. 11. In a state where a wafer W exists between the light emitting device 65 and the photoelectric device 66 facing the same light emitting device 65, the light beam L emitted by the light emitting device 65 is unable to reach the photoelectric device 66, and the existence of the wafer W between the light emitting device 65 and the photoelectric device 66 can be detected from the condition of the photoelectric device 66 in this state. In a state where any wafer W does not exist between the light emitting device 65 and the photoelectric device 66 facing the same light emitting device 65, the light beam L emitted by the light emitting device 65 reaches the photoelectric device 66, and the vacancy of the space between the light emitting device 65 and the photoelectric device 66 facing the same light emitting device 65 can be detected from the condition of the photoelectric device 66 in this state. Thus, whether or riot any wafers W exist in the slots formed in the carrier body 10A is decided for wafer mapping.

Upon the completion of wafer mapping, the holding member 61 is turned through an angle of 90° in the reverse direction to retract the projections 64 from the spaces between the wafers W, and the holding member 61 is returned to its standby position. After the holding member 61 has been moved away from the carrier body 10A, a wafer transporting mechanism, not shown, installed in a transfer chamber 38, not shown, transfers all the wafers W simultaneously from the carrier body 10A to the transfer chamber 38. Then, the lid opening mechanism 40A puts the lid 20 on the carrier body 10A to close the opening 14.

In this state, the wafer detector 55 on the carrier table 33 is actuated.

If any wafer W does not remain in the carrier body 10A, the light beam L1 emitted by the light emitting device of the wafer detector 55 travels through the transparent bottom wall 13 of the carrier body 10A and falls on the corner cube 50 formed in the top wall 11. Then, the light beam L1 is reflected sequentially by the three reflecting surfaces 51 of the corner cube 50, and a reflected light beam L2 travels through the interior of the carrier body 10A along a path substantially coinciding with a path along which the light beam L1 travels to fall on the photoelectric device of the wafer detector 55.

If even one of the wafers W remains in the carrier body 10A, the light beam L1 emitted by the light emitting device is intercepted by the wafer W and is unable to reach the corner cube 50. Consequently, any reflected light beam L2 does not fall on the photoelectric device. Thus, the wafer or wafers W remaining in the carrier body can be detected.

Even if the light beam L1 is reflected by the wafer W, a reflected light beam from the wafer W never falls on the photoelectric device of the wafer detector 55 and hence the reflected light reflected from the wafer W never actuates the photoelectric device of the wafer detector 55. Even if, by any change, the reflected light beam from the wafer W falls on the photoelectric device of the wafer detector 55, the former reflected light beam is intercepted by the polarization filter combined with the photoelectric device of the wafer detector 55. Because the direction of polarization of this reflected light beam is different from that of the reflected light beam L2 reflected from the corner cube 50, so that faulty detection of the wafer W can be prevented.

After the removal of all the wafers from the carrier body 10A has been thus confirmed, the semiconductor device fabricating system 30 executes processes for processing the wafers W. After all the wafers W have been processed by all the processes, the foregoing operations are reversed to return the processed wafers W into the carrier body 10A and to close the opening 14 of the carrier body 10A by the lid 20A.

In the carrier 1A in the second embodiment, the wafer detector 55 may be placed at any suitable position, provided that the light beam L1 emitted by the light emitting device of the wafer detector 55 is able to travel across all the spaces in which the wafers W are to be stored and to fall on the corner cube 50. Therefore, the degree of freedom of design in determining the position of the wafer detector 55 is increased. Accordingly, the wafer detector 55 can be disposed at a position where the wafer detector 55 will not obstruct the transportation of the wafer carrier 1A.

Modifications in the Second Embodiment

[Modification of the Carrier 1A]

Figure 12:
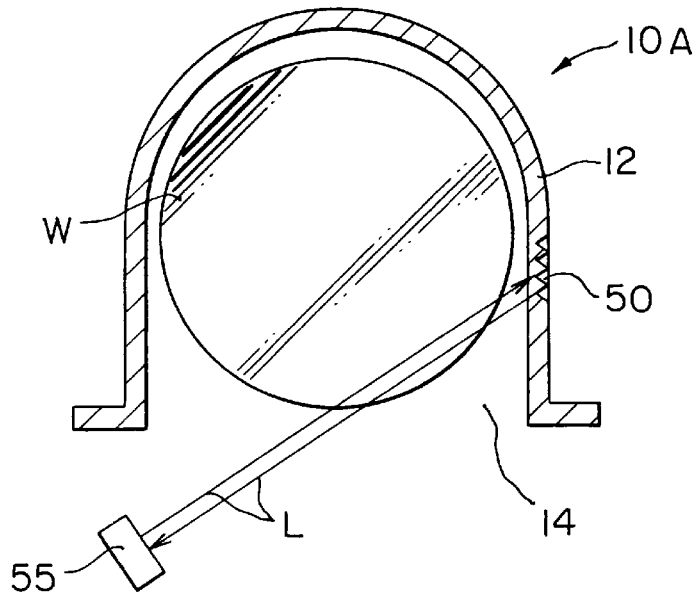
FIG. 12 is a sectional view of an essential part of a modification of the carrier of FIG. 5.

The corner cubes 50 may be formed in the side wall 12 of the carrier body 10A as shown in FIG. 12 instead of in the top wall 11 of the same. In this case, the wafer detector 55 is disposed at a position on one side of a space extending in front of the carrier 1A, i.e., at a position on the inner side of the front panel 31 of the semiconductor device fabricating system 30. In this modification, the wafer detector 55 projects a light beam toward the corner cubes 50, while the same is being moved vertically.

Further, the corner cubes 50 are formed in a part of the side wall 12 extending between the upper and the lower end of the side wall 12. In this case, it is possible to decide whether or not any wafers remain in the carrier body 10A and the positions of the wafers remaining in the carrier body 10A, if any.

As mentioned above, the positions of the corner cubes 50 on the carrier body 10A may be selectively and properly determined.

The corner cubes 50 may be formed in the lid 20A.

[Modification of the Wafer Detecting Unit 60]

Figure 13A:
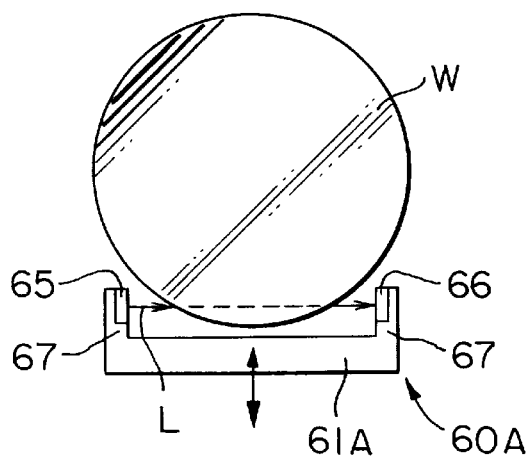
FIGS. 13A and 13B are plan views of a modification of the holding member of the wafer detector.

The configuration of the wafer detecting unit 60 may be changed as follows. A wafer detecting unit 60A shown, by way of example, in FIG. 13A has a holding member 61A formed in a shape substantially resembling the letter U and provided with a pair of projections 67 at its opposite ends. Light emitting devices 65 and photoelectric devices 66 are attached to the inner surfaces of the projections 67, respectively, so as to face each other. When the holding member 61A is set at a working position, the circumference of the wafer W lies between the projections 67 of the holding member 61A. A driving mechanism for driving the holding member 61A may be of any suitable type, provided that the driving mechanism is capable of moving the holding member 61A together with the pneumatic cylinder actuator 63 in the directions of the arrows shown in FIG. 13A or of capable of swinging only the holding member 61A in the directions of the arrows shown in FIG. 13A. When the wafer detecting unit 60A shown in FIG. 13A is employed, the holding member 61A is set at the working position, a light beam L is emitted by each light emitting device 65, and it is decided that any wafer does not exist at a position corresponding to the light emitting device 65 if the associated photoelectric device 66 receives the light beam L or that a wafer W exist at the position corresponding to the light emitting device 65 if the light beam L is intercepted by the wafer W and is unable to reach the associated photoelectric cell 66.

Figure 13B:
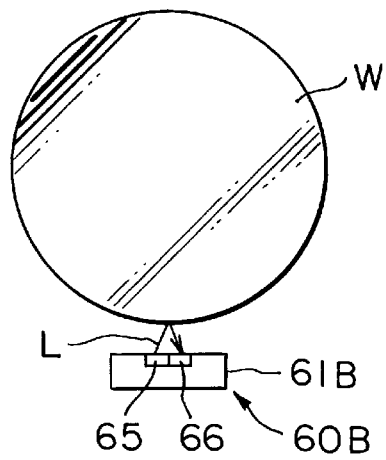

A wafer detecting unit 60B shown, by way of example, in FIG. 13B has a holding member 61B is not provided with any projections corresponding to the projections 67 of the holding member 61A. Pairs of a light emitting device 65 and a photoelectric device 6 disposed side by side are arranged in a vertical column on a surface of the holding member 61B. Each pair of the light emitting device 65 and the photoelectric device 66 is used for detecting a wafer W remaining in each slot 15 formed in the carrier body 10A. When the holding body 61B is set at its working position an a light beam L is emitted by the light emitting device 65, it is decided that a wafer W exist in the slot 15 if the light beam L is received by the photoelectric device 66 or that any wafer W does not exist in the slot 15 if the light beam L is not received by the photoelectric device 66.

In the wafer detecting unit 60A (60B) in the modification, the respective numbers of the light emitting device 65 and the photoelectric devices 66 held on the holding member 61A (61B) are equal to the number of the wafers W which can be stored in the carrier body 10A. However, the holding member 61A (61B) may be provided with a single pair of a light emitting device 65 and a photoelectric device 66, and the holding member 61A (61B) may be moved vertically for scanning to detect the wafer W remaining in the slots 15 of the carrier body 10A, if any.

What is claimed is:

1. A carrier for containing and carrying semiconductor wafers, said carrier comprising:
   a carrier body for containing a plurality of wafers at fixed intervals;
   a lid detachably attached to the carrier body;
   a plurality of projections formed on an inner surface of the lid so that the adjacent projections lie at the opposite sides of a wafer, respectively, when wafers are put in the carrier body and the lid is attached to the carrier body; and
   optical elements provided respectively at the projections to reflect a light beam traveling through each projection substantially in parallel to a surface of the wafer in a direction substantially perpendicular to the surface of the wafer, and to reflect a light beam traveling in a direction substantially perpendicular to the surface of the wafer in a direction substantially parallel to the surface of the wafer.

2. The carrier according to claim 1, wherein each of the projections has an end part having a pair of inclined surfaces intersecting each other,
   each of the inclined surfaces comprises a semitransparent mirror, and
   each of the optical elements serves as the semitransparent mirror.

3. The carrier according to claim 1, further comprising light emitting devices attached to the lid for emitting light beams toward the optical elements and photoelectric devices attached to the lid for receiving the light beams traveled via the optical elements.

4. The carrier according to claim 1, wherein the lid is formed of an optically transparent material.

5. A carrier for containing and carrying semiconductor wafers comprising:
   a carrier body for containing a plurality of wafers at fixed intervals;
   a plurality of projections formed on an inner surface of the carrier body so that adjacent projections lie at the opposite sides of a wafer, respectively, when wafers are put in the carrier body; and
   optical elements provided at the projections to reflect a light beam traveling through each projection substantially in parallel to a surface of the wafer in a direction substantially perpendicular to the surface of the wafer, and to reflect the light beam traveling in a direction substantially perpendicular to the surface of the wafer in a direction substantially parallel to the surface of the wafer.

6. The carrier according to claim 5, wherein each of the projections has an end part having a pair of inclined surfaces intersecting each other,
   each of the inclined surfaces comprises a semitransparent mirror, and
   each of the optical elements serves as the semitransparent mirror.

7. The carrier according to claim 5, further comprising light emitting devices attached to the carrier body for emitting light beams toward the optical elements and photoelectric devices attached to the carrier body for receiving the light beams traveled via the optical elements.

8. The carrier according to claim 5, wherein the carrier body is formed of an optically transparent material.

9. A method of detecting wafers contained in a carrier comprises the steps of:
   projecting a light beam in a direction substantially in parallel to a surface of the wafer on an optical element disposed above or below the surface of the wafer;
   changing said direction of the light beam in another direction substantially perpendicular to the surface of the wafer by the optical element; and detecting the light beam after changing the direction thereof;

wherein a decision is made on whether or not any wafers exist in the carrier on the basis of a result of detection of the light beam.

10. The method according to claim 9, wherein the optical element is a semitransparent mirror.

11. A carrier for containing and carrying semiconductor wafers comprising:

a carrier body for containing a plurality of wafers at fixed intervals and having optically transparent walls; and a corner cube disposed within the carrier body.

12. The carrier according to claim 11, wherein the corner cubes are formed in a wall of the carrier body and have reflecting surfaces facing an interior of the carrier body.

13. The carrier according to claim 12, wherein the corner cube is formed integrally with the wall of the carrier body.

14. A carrier for containing and carrying semiconductor wafers comprising:

a carrier body for containing a plurality of wafers at fixed intervals and having optically transparent walls;

a lid detachably attached to the carrier body; and a corner cube disposed on the lid and having reflecting surfaces facing an interior of the carrier body.

15. A method of detecting wafers contained in a carrier, said method comprising the steps of:

projecting a light beam from outside a carrier body having optically transparent walls through the optically transparent wall on a corner cube disposed within the carrier body; and detecting a reflected light beam reflected from the corner cube at a position outside the carrier body;

wherein a decision is made on whether or not any wafers exist in the carrier on the basis of a result of detection of the reflected light beam.

\* \* \* \* \*